United States Patent [19]

Eckert et al.

[11] 4,371,841

[45] Feb. 1, 1983

[54] CIRCUIT ARRANGEMENT FOR ELIMINATING TURN-ON AND TURN-OFF CLICKS IN AN AMPLIFIER

[75] Inventors: Wolfgang Eckert, Reinfeld; Bernd Holtkamp; Ernst A. Kilian, both of Hamburg, all of Fed. Rep. of Germany

[73] Assignee: U.S. Philips Corporation, New York, N.Y.

[21] Appl. No.: 171,691

[22] Filed: Jul. 24, 1980

[30] Foreign Application Priority Data

Aug. 1, 1979 [DE] Fed. Rep. of Germany ....... 2931144

[51] Int. Cl.³ ............................................. H03F 1/14
[52] U.S. Cl. ...................................... 330/51; 455/174
[58] Field of Search ................ 330/51, 284, 295, 297; 455/174, 194

[56] References Cited

U.S. PATENT DOCUMENTS 3,992,677 11/1976 Tsurushima ........................... 330/51

Primary Examiner—James B. Mullins
Assistant Examiner—Gene Wan
Attorney, Agent, or Firm—Thomas A. Briody; William J. Streeter; Laurence A. Wright

[57] ABSTRACT

The circuit arrangement in accordance with the invention comprises an RC-element, to which the same direct voltage is applied as the amplifier. When the direct voltage is switched on or off the capacitor is either charged or discharged, the resulting oppositely directed voltages being applied to the anti-parallel base-emitter junctions of two transistors, whose collectors are interconnected. The collector voltage of these transistors serves to control a semiconductor switch included in the audio frequency branch.

7 Claims, 2 Drawing Figures

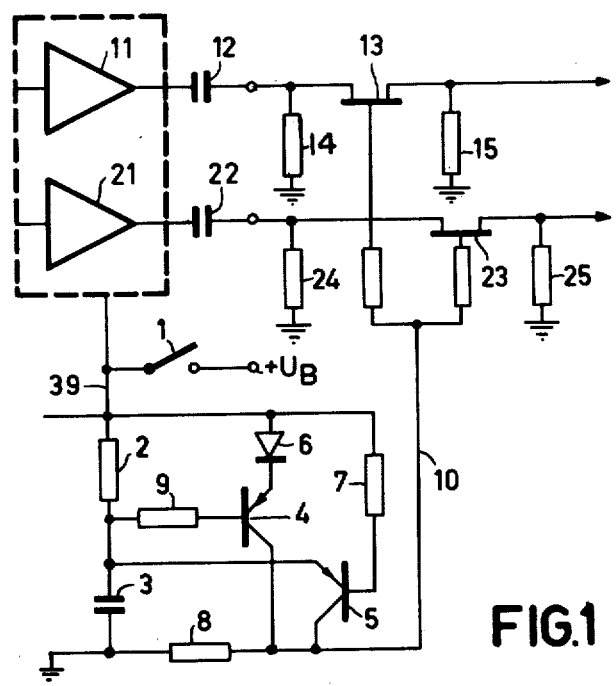
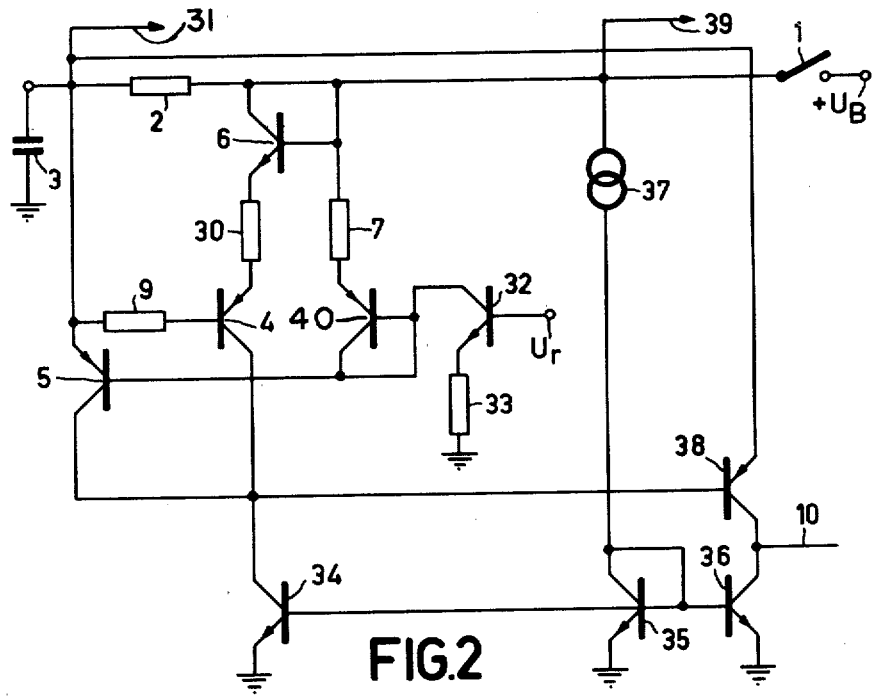
FIG.1
FIG.2

4,371,841

CIRCUIT ARRANGEMENT FOR ELIMINATING TURN-ON AND TURN-OFF CLICKS IN AN AMPLIFIER

The invention relates to a circuit arrangement for eliminating turn-on and turn-off clicks in an amplifier, by including a controllable switching device after the amplifier to interrupt the signal path.

BACKGROUND OF THE INVENTION

If the supply voltage for an amplifier, which amplifies the audio-frequency signal for a loudspeaker arrangement, is turned on or off, the connected loudspeaker will generally produce a turn-on or turn-off click. In order to avoid this, it is known to include a contact in the signal path after the amplifier, which contact is actuated together with the contact for the supply voltage. This contact is susceptible to failure and is not actuated when the supply voltage is turned on or off respectively by removing or inserting the mains plug.

Furthermore, from DE-OS No. 23 22 317 an amplifier for acoustic signals is known, which eliminates the clicking noise upon turn-on of the power supply in that the output potential of the amplifier stage is continuously increased from a basic value to the predetermined operating voltage. This amplifier is provided with a starting switch comprising a transistor circuit, whose base-emitter junction is connected in parallel with the charging resistor of a capacitor which is connectable to the power supply voltage. This circuit arrangement is comparatively intricate and moreover it is only intended and suitable for eliminating turn-on clicks.

OBJECT OF THE INVENTION

It is the object of the present invention to provide a circuit arrangement by means of which turn-on and turn-off clicks are eliminated electronically in a simple manner.

SUMMARY OF THE INVENTION

This problem is solved in that the supply voltage applied to the amplifier is connected to the series connection of a capacitor and a resistor, that the resistor is connected in parallel with the base-emitter junctions of two transistors, the first transistor being arranged so that it is turned on by the voltage drop produced across the resistor by the charging current and the second transistor being arranged so that it is turned on by the voltage drop produced across the resistor by the discharge current of the capacitor, and that the collector currents of the two transistors serve for controlling the switching device. Upon switching on, the capacitor is charged via the resistor, so that the first transistor is turned on and controls the controllable switching device so that the signal path is blocked. Upon switching off the supply current, the amplifier discharges the capacitor via the resistor so that the second transistor is turned on and controls the controllable switching device. Thus, the signal path is also blocked. In the steady state (the capacitor is then almost fully charged), no significant current will flow through the resistor. Thus, neither of the two transistors conducts and the signal path is not blocked.

In one embodiment of the invention the two transistors are of the same conductivity type. The base of the first and the emitter of the second transistor are connected to the resistor terminal which is connected to the capacitor and the emitter of the first and the base of the second transistor are connected to the resistor terminal which is connected to the power supply terminal. The collectors of the two transistors may then be connected in parallel, which facilitates control of the controllable switching device.

When the supply voltage is turned off the second transistor does not respond until the discharge current is sufficiently large. That is, the voltage drop across the resistor corresponds at least to the base-emitter voltage of the second transistor. The discharge current should even be larger if a part of the amplifier is energized by the capacitor's voltage, because in that case the power-supply current will flow through the resistor in a direction opposite to the discharge current. However, a click may then already have become audible. This can be avoided if, in accordance with a further embodiment of the invention, the base of the second transistor is connected to the supply voltage terminal via a two-terminal element having a d.c. resistance which is not zero and if a direct current flows through the two-terminal element which is proportional such that the second transistor just remains cut-off in the steady state.

The second transistor is then turned on before the click has become audible. Moreover, said two-terminal element limits the base current of the transistor and thus protects said transistor against damage.

In accordance with a further embodiment of the invention the emitter line of the first transistor includes a diode. This is of advantage in those cases when a part of the amplifier is connected to the capacitor, so that in the steady state a voltage drop occurs across the resistor, which has the same polarity as during the charging of the capacitor. Thus, the first transistor could be turned on. The diode in the emitter line then ensures that this is impossible in the steady state.

BRIEF DESCRIPTION OF THE DRAWINGS

The invention will be described in more detail with reference to the drawing which shows an embodiment. In the drawing:

FIG. 1 shows a first embodiment; and

FIG. 2 shows a second embodiment which is particularly suitable for being realized in integrated circuit technology.

DETAILED DESCRIPTION OF THE PREFERRED EMBODIMENTS

FIG. 1 represents the signal path of a two-channel amplifier arrangement for audio signals. Each channel comprises an amplifier 11 or 21, for example a volume-control circuit in the form of an integrated circuit TCA 730 or a tone-control circuit in the form of the integrated circuit TCA 740. The supply voltage $U_B$ for these two amplifiers is applied to the corresponding connections via a switch 1. Via a coupling capacitor 12 or 22 the output of the respective amplifier 11 or 21 is connected to the source-drain channel of a field-effect transistor 13 or 23, which channel is included in the signal path, said transistors being driven by the signal on their gate electrodes, which are connected to the control line 10. The source electrode of the field-effect transistor 13 and 23 are connected to earth via a 39-kohm resistors 15 and 25, respectively. The drain electrode of transistors 13 and 23 are also connected to earth via a 12-kohm resistors 14 and 24 14 respectively, so that a d.c. path is obtained via the field-effect transistor.

At the same time the power supply voltage $U_B$ is applied to the series connection of a 12-kohm resistor 2 and a 47-$\mu$F capacitor 3 via a line 39. Via a 12-kohm resistor 9 the connection point of capacitor 3 and resistor 2 is connected to the base electrode of a pnp-transistor 4, type BC 558, whose emitter is connected to the line 39 via a diode 6, type BAV 19, which is included in the forward direction. Via a 12-kohm resistor 7 line 39 is also connected to the base of a pnp-transistor 5, which may also be of the type BC 558 and whose emitter is connected to the connection point of capacitor 3 and resistor 2. The collectors of the transistors 4 and 5 are interconnected. Their common collector line includes a resistor 8, which is connected to earth.

The circuit operates as follows: Upon switching on, contact 1 is closed so that a current can flow on the one hand to the amplifiers 11, 21 and on the other hand to the RC element 2, 3. As a result, capacitor 3 is charged. This results in a voltage drop across resistor 2, which turns on transistor 4, while transistor 5 remains cut-off. Resistor 9 protects transistor 4 against overloading. Transistor 4 then substantially constitutes a short-circuit, so that on the connection point of collectors 4 and 5 with resistor 8, to which the control line 10 is also connected, a positive voltage appears which is only slightly lower than the battery voltage. As a result of this field-effect transistors 13 and 23 are turned off.

If the voltage across capacitor 3 has become almost equal to the supply voltage $U_B$, the charging current through resistor 2, or the resulting voltage drop across this resistor, becomes so small that transistor 4 is cut off. Thus, no more current will flow through the resistor 8, so that the potential on the control line 10 becomes substantially equal to earth potential. As a result of this field-effect transistors 13 and 23 are turned on, so that the signal supplied by the amplifiers 11 and 21 can be applied to the following devices in the two amplifier channels.

When the battery voltage $U_B$ is turned off by opening the switch 1, the current for the amplifiers 11 and 12 will be supplied for some time by the capacitor 3 which has been charged to the battery voltage, a discharge current with direction opposed so that of the charging current flowing through the resistor 2. Resistor 2 is proportioned such that the voltage drop produced across it suffices to turn on the transistor 5. Its collector current, which flows through the resistor 8, produces a positive potential on the control line 10, by which the field-effect transistors 13 and 23 are cut off again, when the power supply is switched off. After switching off, the discharge current approximately decreases as an exponential function, until the voltage drop across resistor 2 has become so small that transistor 5 is cut off again, as a result of which transistors 13 and 23 are turned on again. By suitably proportioning resistor 2, however, it can be achieved that this is effected at an instant at which no voltage variation that could be reproduced as a clicking sound occurs in the signal path, which is then open again.

The circuit shown in FIG. 2, which is particularly suitable for realization in integrated circuit technology, also comprises the series connection of a resistor 2 and a capacitor 3 which together with the amplifier(s), not shown, can be connected to the supply voltage $+U_B$ via the switch 1. Via the line 31 the voltage across capacitor 3 is applied to a point of the amplifier which requires a highly smoothed voltage. The current which then flows through the line 31 therefore also produces a voltage drop across resistor 2 in the steady state, which voltage drop should be taken into account when designing the circuit.

Via a resistor 9 the connection point of the RC element 2, 3 is again connected to a transistor 4 whose emitter line includes a 390-ohm resistor 30 in series with a transistor 6, which is arranged as a diode in the forward direction. The collector of said transistor 4 is again connected to the collector of a transistor 5, whose emitter is connected to the connection point of the RC element 2, 3. Via the series connection of a resistor 7 a transistor 40 connected as a diode is connected to the line 39 via which the voltage $U_B$ is applied. Through this series connection a current flows which is applied by a current source comprising the collector-emitter path of a transistor 32, whose emitter line includes a resistor 33, which is connected to earth, and whose base terminal is connected to a direct voltage $U_r$. The direct voltage $U_r$ and the emitter resistor 33 are proportioned such that across the said series connection the collector current of the transistor 32 produces such a voltage drop that the transistor 5 just remains cut off, but is turned on when the voltage between its emitter and base increases by some 100 mV. This ensures that the transistor 5 responds rapidly to a power switch off.

The interconnected collectors of the transistors 4 and 5 are connected to the collector of a transistor 34, whose emitter is connected to earth and whose base is connected to the base of a transistor 35, whose base is connected to its collector, its emitter also being connected to earth. To the base of the transistor 35 the base of a further transistor 36 is connected, whose emitter is also connected to earth and to whose collector electrode the control line 10 for controlling the controllable switching device 13, 23 is connected. The collector line of the transistor 35 includes a current source 37, in which by means of the shown current mirror arrangement with the transistors 34, 35 and 36 is obtained that the current through the transistors 34 and 36 respectively is approximately equal to the current through the transistor 35. Transistors 32, 34, 35 and 36 are of a conductivity type opposite to that of the transistors 4 and 5.

Connected to the common collector connection of the transistors 4, 5 and 34 is the base of a further transistor 38, which is of the same conductivity type (pnp) as the transistors 4 and 5, and whose collector is connected to the collector of a transistor 36 and whose emitter is connected to the connection point of the RC element 2, 3.

The circuit operates as follows: When the switch 1 is closed, the charging current of capacitor 3 flows through the resistor 2, so that transistor 4 is turned on. The base voltage of the transistor 38 then becomes equal to the value of the battery voltage minus the voltage drop across the elements 6, 30 and 4, while the emitter is at the capacitors potential, which initially is still comparatively low. The transistor 38 is consequently cut off, so that a low voltage appears on the output when the power is switched on. If a high potential is required for blocking the controllable switching device, which is not shown in FIG. 2, an additional phase inverter may be included in the line 10.

As the capacitor 3 is charged further, the voltage across the resistor 2 will decrease until transistor 4 is cut off. True the current through the line 31 then still produces a voltage drop across the resistor 2, but the diocde 6 in the emitter line prevents transistor 4 from being turned on thereby.

In this steady state, in which the transistors 4 and 5 are both cut off, the emitter of the transistor 38 will be at positive potential; its base current corresponds to the current 37 supplied by the current source, so that transistor 38 is turned on and the potential at the control line 10 becomes positive, as a result of which the controllable switching device again opens the signal path.

If the supply voltage is turned off by opening the switch 1, a current will flow from the capacitor 3, via the resistor 2 and the line 39, to the amplifier section connected thereto. This current has an opposite direction with respect to the charging current and already turns on transistor 5 when the voltage on the line 39 has dropped only a few 100 mV below the supply voltage $U_B$. As a result of this transistor 38, whose base-emitter junction is then short-circuited by the conducting collector-emitter path of the transistor 5, is cut off, so that the output line is again almost at earth potential and the signal path is blocked. After the voltage on the line 39 has dropped only slightly below the operating voltage, a turn-off clock will have no effect because the signal path is blocked.

The circuit arrangement in accordance with the invention also suppressed turn-on and turn-off clicks when the supply voltage is not turned on or off by closing or opening the switch 1, but by inserting or removing the mains plug via which the voltage is applied from which the supply voltage $U_B$ is derived. This is because the operation of the circuit only depends on the voltage on the line 39 and its variation.

The circuit arrangement shown in FIG. 2 together with the amplifier, whose turn-on and turn-off clicks are to be avoided, may advantageously be integrated on a common semiconductor substrate. As this amplifier circuit at any rate requires a connection for the supply voltage and a connection for the capacitor 3 in order to obtain a smooth supply voltage on the line 31, the circuit in accordance with the invention requires only one more external connection (pin), namely that via which the control line 10 is connected to the controllable switching device.

What is claimed is:

1. A circuit arrangement for eliminating turn-on and turn-off clicks in an amplifier comprising:
   an amplifier,
   a controllable switching device for interrupting the signal path of said amplifier included in the signal path after said amplifier,
   a supply voltage,
   a series connection of a capacitor and a resistor said supply voltage connected to said amplifier through said capacitor and resistor,
   two transistors the base-emitters of said transistors being connected in parallel with said resistor, a first one of said transistors being arranged such that it is turned on by the voltage drop produced across said resistor by the charging current of said capacitor and the second transistor being arranged such, that it is turned on by the voltage drop produced across said resistor by the discharge current of said capacitor, and the collector currents of said transistors serving to control said switching device.

2. A circuit arrangement as claimed in claim 1, wherein said transistors are of the same conductivity type, the base of said first and emitter of said second transistor being connected to that terminal of said resistor which is connected to said capacitor, and the emitter of said first and the base of said second transistor being connected to the terminal of said resistor which is connected to said supply voltage.

3. A circuit arrangement as claimed in claim 2, wherein the base of said second transistor is connected to said supply voltage terminal via a two-terminal element having d.c. resistance which is not zero.

4. A circuit arrangement as claimed in claim 3, wherein said two-terminal element comprises a diode.

5. A circuit arrangement as claimed in claim 3, wherein a direct current flows through said two-terminal element which current is proportioned such that said second transistor just remains cut-off in the steady state.

6. A circuit arrangement as claimed in claim 1, wherein the base terminal of said first transistor includes a resistor.

7. A circuit arrangement as claimed in claim 1, wherein the emitter terminal of said first transistor includes a diode.

* * * * *